United States Patent [19]
Ohmi et al.

[11] Patent Number: 5,370,274
[45] Date of Patent: Dec. 6, 1994

[54] APPARATUS FOR CLEANING A WAFER SURFACE

[76] Inventors: Tadahiro Ohmi, 1-17-301, Komegabukuro 2-chome, Aoba-ku, Sendai-shi, Miyagi-ken 980; Tadashi Shibata, 5-2, Nihondaira, Taihaku-ku, Sendai-shi, Miyagi-ken 980, both of Japan

[21] Appl. No.: 124,109

[22] Filed: Sep. 20, 1993

Related U.S. Application Data

[62] Division of Ser. No. 859,363, May 22, 1992, abandoned.

[30] Foreign Application Priority Data

Nov. 24, 1989 [JP] Japan ................................ 64-305629

[51] Int. Cl.⁵ ............................................. B67D 5/52
[52] U.S. Cl. ............................ 222/135; 222/144.5; 222/146.5; 222/252; 222/394; 239/307
[58] Field of Search ...................... 222/133, 134, 144.5, 222/145, 630, 637, 252, 394, 400.7, 135, 146.5, 146.2; 239/304, 307, 310, 318, 135, 373

[56] References Cited

U.S. PATENT DOCUMENTS

| | | | |
|---|---|---|---|
| 3,224,637 | 12/1965 | Muller et al. ......................... | 222/57 |
| 3,322,350 | 5/1967 | Heinicke et al. ................. | 239/304 x |
| 3,380,658 | 4/1968 | Stasz et al. ........................ | 239/304 |
| 3,788,547 | 1/1974 | Stahl et al. ....................... | 239/304 X |
| 3,917,172 | 11/1975 | O'Hare .............................. | 239/307 X |
| 4,020,977 | 5/1977 | Hechler ............................. | 222/145 |
| 4,029,260 | 6/1977 | Herrick .............................. | 239/282 |
| 4,390,035 | 6/1983 | Hill .................................... | 222/145 X |
| 4,691,850 | 9/1987 | Kirschmann ................. | 222/144.5 X |
| 5,074,438 | 12/1991 | Ingram ....................... | 222/144.5 X |
| 5,259,557 | 11/1993 | Spriggs et al. ...................... | 239/304 |

FOREIGN PATENT DOCUMENTS

| | | |
|---|---|---|
| 57-47222 | 8/1955 | Japan . |
| 57-148846 | 9/1982 | Japan . |
| 61-21753 | 1/1986 | Japan . |
| 2176908A | 1/1987 | United Kingdom . |

*Primary Examiner*—Gregory L. Huson
*Attorney, Agent, or Firm*—Baker & Daniels

[57] ABSTRACT

A cleaning apparatus for cleaning with a mixture of various chemicals. The cleaning apparatus includes a compressor for compressing and transferring a solution medium, at least one jet pipe, one end of which is connected to the compressor and the other end of which is open, and a plurality of suction pipes, connected to the jet pipe at a specified interval, respectively. The apparatus further includes a plurality of chemical tanks with an open end of the suction pipe being inserted into each of the chemical tanks, respectively. The invention permits a number of objects to be cleaned sequentially without being contaminated by making use of the principal of aspiration. In addition, the compressor is used only to pass the solution medium therethrough inside of the compressor and is never corroded by the mixture of chemicals.

11 Claims, 3 Drawing Sheets

APPARATUS FOR CLEANING A WAFER SURFACE

This is a division of application Ser. No. 07/859,363, filed May 22, 1992, now abandoned.

BACKGROUND OF THE INVENTION

1. Field of the Invention

The present invention relates to cleaning equipment for cleaning a wafer surface with a mixture of various chemicals.

2. Description of Related Art

In conventional types of cleaning equipment, when it is necessary, for instance, to sequentially clean a number of objects (such as wafers), at first a mixture of chemicals is put in a vessel such as a beaker, and then an object to be cleaned is steeped in said mixture of chemicals, and after it is taken out from the mixture of chemicals, the next object to be cleaned is steeped in the mixture of chemicals, thus this step being repeated.

With the construction based on prior art as described above, however, as objects to be cleaned are steeped sequentially in a mixture of chemicals, an object cleaned later in the mixture of chemicals is steeped in a more contaminated mixture of chemicals, which is not preferable.

In this case, such a method as exhausting a mixture of various chemicals with a compressing means (a pump) for sequentially cleaning objects to be cleaned may be used. In this method, such problems as corrosion of the compressing means (a pump) may occur due to the chemicals. An object of the present invention is to provide, for the purpose to solve the problems as described above, a cleaning equipment in which objects to be cleaned can sequentially and repeatedly be cleaned without being contaminated and such problems as corrosion due to chemicals used for cleaning can be prevented.

SUMMARY OF THE INVENTION

To achieve the object as described above, an invention is characterized in that the construction according to the invention includes a compressing means to compress and transfer a solution medium, at least one jet pipe, one end of which is connected to an edge of the compressing means and another edge of which is open, a plurality of suction pipes connected to the jet pipe or jet pipes at a specified interval, each communicated to the jet pipe, and a plurality of chemical tanks with an open end of each suction pipe inserted to each of the chemical tanks respectively.

An invention is characterized in that the aforesaid jet pipe has a heating means to improve the cleaning effect.

An invention is characterized in that each of the aforesaid plurality of suction pipes has a flow rate control valve to change a composition ratio of each chemical.

An invention is characterized in that a connecting section of the aforesaid jet pipe to each of the aforesaid suction pipes has a smaller diameter than that of other sections so that a mixing efficiency of a solution medium with chemicals will be furthermore improved. An invention is characterized in that the aforesaid chemical tank has a pressurizing means for pressing a chemical in the chemical tank with a gas to furthermore improve the mixing efficiency of chemicals.

In accordance with an embodiment of the present invention, if a solution medium such as, for instance, pure water is compressed and transferred from one end to another end of a jet pipe with a pressurizing means, a chemical in each chemical tank is sucked up from the chemical tank into the solution medium flowing through the jet pipe, and a mixture of the solution medium and the chemicals is exhausted, as a mixture of chemicals, from an opening at another end of the jet pipe.

In accordance with an alternative embodiment of the present invention, as a solution medium, which flows in a jet pipe, is heated by a heating means, the efficiency of processing with a mixture of chemicals and a solution medium can be improved. In yet another embodiment, the composition of the aforesaid mixture of chemicals can freely be changed by adjusting opening degrees of the flow rate control valves.

According to one aspect of the present invention a flow velocity of a solution medium in a connecting section between a jet pipe and a suction pipe can be increased.

As a surface of a chemical is pressurized by the pressurizing means, the efficiency in mixing the chemical with a solution medium can furthermore be raised.

Description of the Numerals

1 . . . Jet pipe, 2 . . . Compressing pump (Compressing means), 4a, 4b . . . Branch pipe, 5a, 5b . . . Chemical tank, 6 . . . Object to be scrubbed, 10, 11 . . . Heating means, 13a, 13b . . . Pressurizing means

DESCRIPTION OF THE PREFERRED EMBODIMENTS

Figure 1:
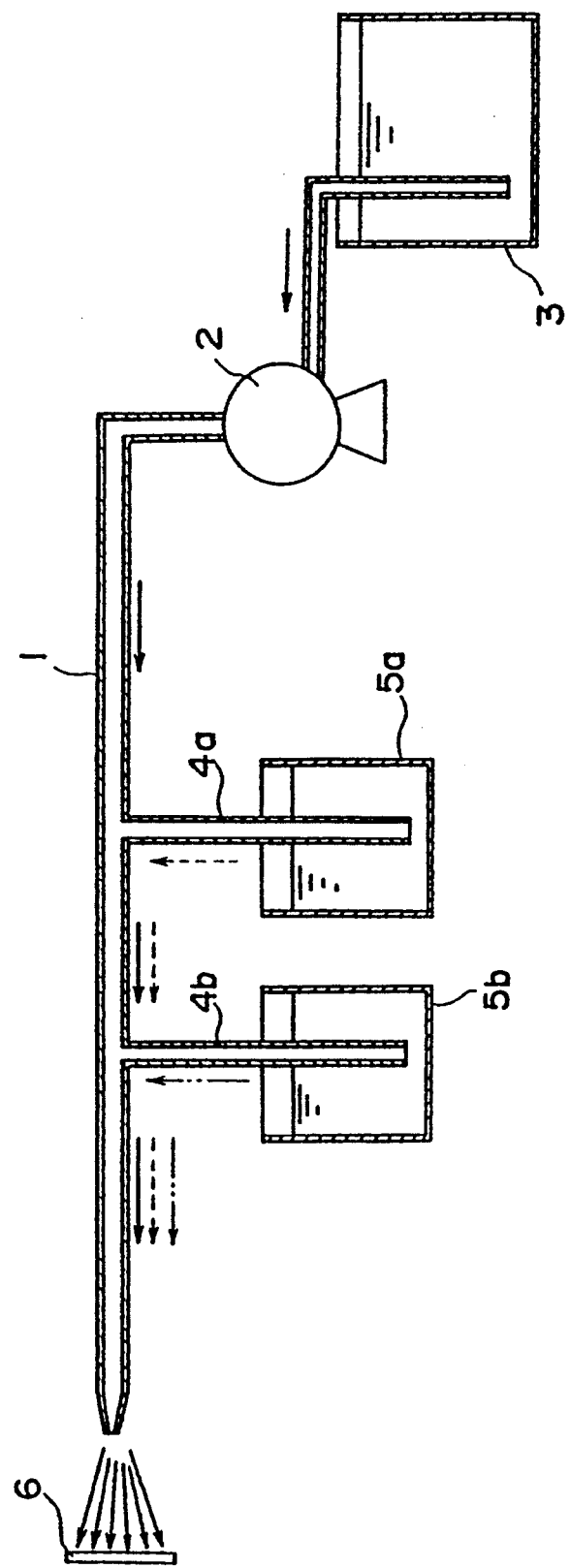
FIG. 1 is a sectional view showing a first embodiment of the present invention.

FIG.1 shows a first embodiment of the cleaning system of the present invention, wherein a compressing pump 2 as a compressing means is arranged at an edge (the right edge in the figure) of a horizontal jet pipe 1 and the compressing pump 2 has a solution medium storage tank 3, in its upstream side, in which a solution medium is stored. To the aforesaid jet pipe 1 are connected at a specified interval, for instance, 2 suction pipes 4a and 4b, each communicated to said jet pipe 1, and the suction pipes 4a and 4b are inserted into chemical tanks 5a and 5b respectively with various types of chemical being stored in the chemical tanks 5a and 5b.

And, one end (the left edge in FIG. 1) of the aforesaid jet pipe 1 is tapered with an opening at its tip, so that an object to be cleaned is placed against the end opening.

As the first embodiment has the construction as described above, when the compressing pump 2 is driven, the solution medium sucked up from the solution medium storage tank 3 flows in the jet pipe 1 along its longitudinal direction. Then, chemicals stored in the chemical tanks 5a and 5b respectively are sucked up from the chemical tanks because of the principle of aspirator, namely due to a jet of the solution, and mixed with the solution medium in the jet pipe 1, and exhausted from the end opening of the jet pipe 1. And, an object to be cleaned is cleaned by this exhausted mixture of chemicals. Herein, the compressing pump 2 may be either of the type that feeds a chemical either at a constant rate or of the type that feeds a chemical spasmodically like a diaphragm. Also a plurality of jet pipe 1 may be used in the construction according to the present invention.

Figure 2:
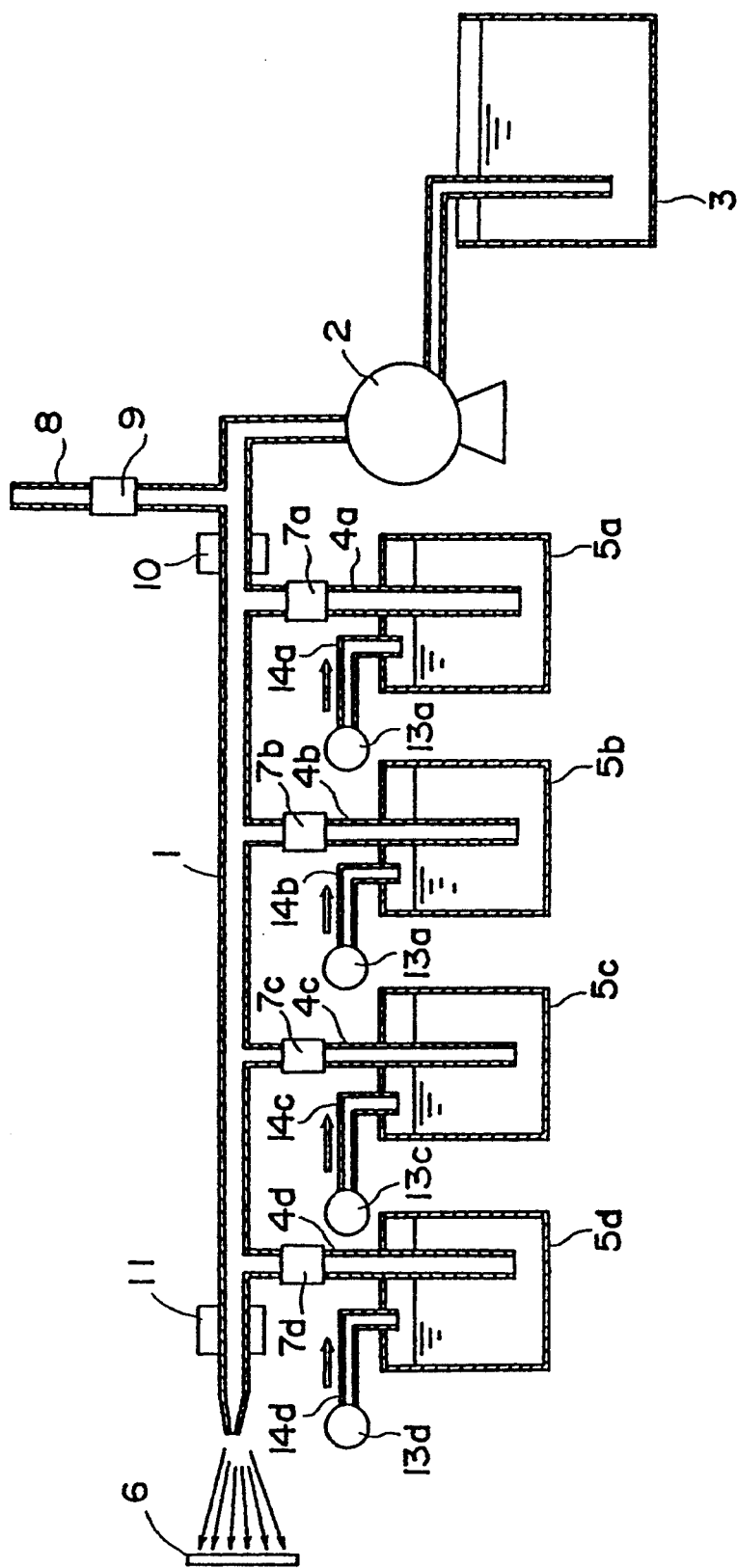
FIG. 2 is a sectional view showing a second embodiment of the present invention.

FIG. 2 shows a second embodiment of the present invention, wherein suction pipes 4c and 4d and chemical tanks 5c and 5d are added to the construction according to the aforesaid first embodiment, a branch pipe 9 having a flow rate control valve 8 is arranged in the downstream from the compressing pump 2, and furthermore, for instance, heating means 10 and 11 comprising an electrothermal coil respectively at, for instance, the upstream end or the downstream end. Also pressurizing means 13a to 13d, which supply an inactive gas to the chemical in each of the aforesaid chemical tanks 5a to 5d through gas supply pipes 14a to 14d respectively, are arranged.

With the construction according to the second embodiment of the present invention, when it is necessary, for instance, to carry out so-called RCA cleaning, the following sequence is employed.

At first, pure water is stored in the solution medium tank 3, and $H_2O$ liquid, $NH_4OH$ liquid, HCl liquid, and HF liquid are stored in the chemical tanks 5a to 5d respectively.

In a first cleaning process, at first the two flow rate control valves 7c and 7d are fully closed so that only the two chemicals ($NH_4OH$, $H_2O_2$) are sucked up, and the mixture of chemicals obtained through the operation described above is exhausted against a wafer 6. In this case, in order to adjust the mixing ratio of the solution medium ($H_2O$) vs the two chemicals ($H_2O_2$, $NH_4OH$) to, for instance, 1:1:5, opening degrees of the flow rate control valves 7a and 7b area adjusted, and if the opening degree is insufficient, a quantity of a chemical to be sucked up is adjusted by using the pressurizing means 13a or 13b to push down the level of the chemical with a gas which is inactive to the chemical (for instance, N, gas). Furthermore, the heating means 10 and 11 are run to heat the mixture of chemicals up to, for instance, the boiling state.

Then, in a second cleaning process, each of the flow rate control valves 7a to 7d is completely closed, and the wafer 6 is cleaned only by the pure water sucked up from the solution tank 3.

Then, in a third cleaning process, the two flow rate control valves 7b and 7d are fully closed so that the two types of chemicals ($H_2O_2$, HCl) are sucked up and the ratio of $H_2O$ vs $H_2O_2$ VS HCL is adjusted to 5:1:1. Also in this process, like in the aforesaid first process, the heating means 10 and 11 are run to clean wafers with the heated mixture of chemicals.

Then, in a fourth cleaning process, like in the aforesaid second process, each of the flow rate control valves 7a to 7d is completely closed, and cleaning with only pure water is carried out.

Then, in a fifth cleaning process, the flow rate control valves 7a to 7c are closed so that only one chemical (HF) will be sucked up and the ratio of solution medium ($H_2O$) and chemical (HF) will be adjusted to, for instance, 50:1.

Finally, in a sixth cleaning process, like in the aforesaid second and fourth processes, cleaning with only pure water is carried out, and then a drying process is started.

To carrying out this drying process, it is necessary to stop operation of the compressing pump 2 and fully open, for instance, a flow rate control valve 9 for a branch pipe 8 and to send $N_2$ gas (or Ar gas) into the jet pipe 1 with the pressurizing means 13a to 13d by driving the heating means 10 and 11 and exhaust the gas from the end of the jet pipe 1. With this construction, the necessity to arrange a drying means separately is eliminated.

It should be noted that, with the branch pipe 8 arranged in the construction, a flow rate of the compressing pump 2 can be controlled by adjusting an opening degree of the flow rate control valve 9. Also it should be noted that, although a case of scrubbing wafers by means of RCA scrubbing as described as an example of application of this invention, the present invention is also applicable to other forms of cleaning such as cleaning after separating resist by using a mixture of, for instance, alcohol as a solution medium and acetone and trichloroethane as chemicals.

Figure 3:
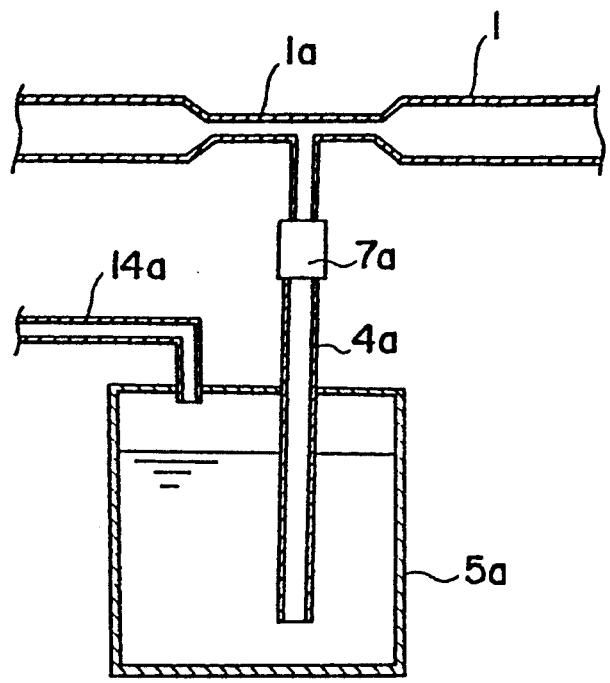
FIG. 3 is a sectional view showing another embodiment of a jet pipe section.

FIG. 3 shows other embodiment of the jet pipe 1, and in the connecting section between the jet pipe 1 and the suction pipe 4a, a diameter of the jet pipe is smaller that that in other sections. Other sections of this construction are the same as those in the second embodiment. With this construction, a flow velocity of a solution medium in the aforesaid connecting section increases, and the sucking rate of a chemical the chemical tank 4a also increases in proportion to the increase of flow velocity above.

Figure 4:
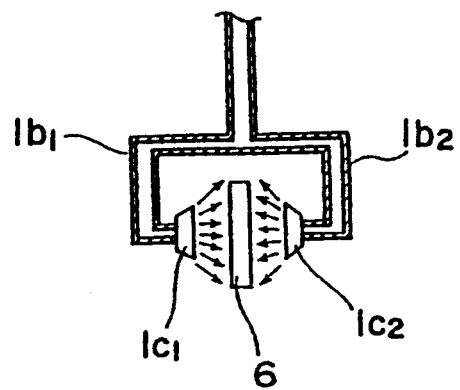
FIG. 4 is a sectional view showing another embodiment of an end section of the jet pipe.

FIG. 4 shows other embodiment of the end opening of the jet pipe 1, and this embodiment has the construction wherein said end opening is branched to two branch pipes, exhaust nozzles $1c_1$ and $1c_2$ are arranged facing tips of the branch pipes $1b_1$ and $1b_2$ respectively, and an object to be cleaned is placed between the two exhaust nozzles $1c_1$ and $1c_2$.

In this construction, the object to be cleaned can be cleaned from both sides, which contributes to improvement of the cleaning efficiency.

If a material with a surface finished to a mirror-like state by means of, for instance, electrolytic compound polishing and oxidized film passivation formed on it by supplying high purity oxygen under a high temperature (around 400° C.) is used for internal surface (which is contacted by a liquid) of such sections as the jet pipe through which the solution medium flows, elution of metallic components can be prevented.

An embodiment of the present invention comprises a compressing means to compress and transfer a solution medium, at least one jet pipe, one end of which is connected to the compressing means and other end of which is open, a plurality of suction pipes connected to the jet pipe at a specified interval, each communicated to each jet pipe, and a plurality of chemical tanks with an open end of each suction pipe inserted into each chemical tank respectively, so that a large number of objects to be cleaned can sequentially be cleaned without being contaminated by making use of the principle of aspirator. Also, as the compressing means is used only to pass a solution medium, inside of the compressing means is never corroded by a mixture of chemicals.

The aforesaid jet pipe has a heating means additionally arranged in the construction, so chemicals can easily be mixed and such a processing as boiling the mixture of chemicals can be made, which contributes to improvement of the cleaning efficiency.

The aforesaid plurality of suction pipes has a flow rate control valve respectively, so a mixing ratio of chemicals to be mixed together can be changed arbitrarily by adjusting opening degrees of the flow rate control valves, and also types of chemicals to be mixed together can arbitrarily be changed by opening or closing the flow rate control valves.

According to the present invention, it is possible to increase a quality of any chemical to be sucked up by making higher the jet velocity of a solution medium.

With the invention according to claim 5, in the construction as claimed in claim 1, the aforesaid chemical tank has a compressing means to push up a level of the chemical by using a gas, the sucking rate of the chemical into the jet pipe can easily be increased, and at the same time the gas can be exhausted from an end of the jet pipe by discharging the chemical and pressurizing only the gas.

We claim:

1. A chemical mixing and cleaning system for cleaning a wafer surface comprising:
   a solution medium storage tank for storing a solution medium;
   at least one jet pipe for dispensing and transporting mixed chemicals from a one end thereof to an outlet thereof, said jet pipe being in fluid communication with said solution medium storage tank;
   a pump in said jet pipe for compressing and transferring said solution medium;
   a plurality of chemical storage tanks for storing chemicals; and
   a suction pipe extending from each of said plurality of chemical storage tanks, wherein a first end of said suction pipe is in fluid communication with said jet pipe and a second and opposite end of said suction pipe is in fluid communication with said jet pipe and a second and opposite end of said suction pipe is in fluid communication with said respective chemical storage tank, said chemical storage tanks being located between said solution medium storage tank and said outlet, and said pump being located upstream of each of said plurality of suction pipes whereby mixed chemicals may be dispensed onto a said wafer surface from said jet pipe outlet.

2. The chemical mixing and cleaning system according to claim 1, including a heating means located on said jet pipe for heating said solution medium.

3. The chemical mixing and cleaning system according to claim 1, wherein each of said plurality of suction pipes has a flow rate control valve located therein.

4. The chemical mixing and cleaning system according to claim 1, wherein a connecting section of said jet pipe to at least one of said suction pipes has a smaller diameter as compared to those of other sections of said jet pipe.

5. The chemical mixing and cleaning system according to claim 1, wherein at least one of said plurality of chemical storage tanks has a gas pressurizing means for pressurizing a chemical in said at least one chemical storage tank.

6. The chemical mixing and cleaning system according to claim 2, wherein each of said plurality of suction pipes has a flow rate control valve located therein.

7. The chemical mixing and cleaning system according to claim 2, wherein a connecting section of said jet pipe to at least one of said suction pipes has a smaller diameter as compared to those of other sections of said jet pipe.

8. The chemical mixing and cleaning system according to claim 3, wherein a connecting section of said jet pipe to at least one of said suction pipes has a smaller diameter as compared to those of other sections of said jet pipe.

9. The chemical mixing and cleaning system according to claim 3, wherein said chemical tank has a gas pressurizing means for pressurizing a chemical in said at least one chemical tank.

10. The chemical mixing and cleaning system according to claim 3, wherein said chemical tank has a gas pressurizing means for pressurizing a chemical in said at least one chemical.

11. The chemical mixing and cleaning system according to claim 4, wherein said chemical tank has a gas pressurizing means for pressurizing a chemical in said at least one chemical tank.

* * * * *

UNITED STATES PATENT AND TRADEMARK OFFICE
CERTIFICATE OF CORRECTION

PATENT NO. : 5,370,274
DATED : December 6, 1994
INVENTOR(S) : Tadahiro Ohmi

It is certified that error appears in the above-identified patent and that said Letters Patent is hereby corrected as shown below:

Claim 1, column 5, line 40, after "with" delete "said jet - pipe";

Claim 1, column 5, line 41, delete in its entirety;

Claim 1, column 5, line 42, delete "is in fluid communication with".

Signed and Sealed this

Seventh Day of March, 1995

Attest:

BRUCE LEHMAN

Attesting Officer

Commissioner of Patents and Trademarks